United States Patent
Cao et al.

(10) Patent No.: US 12,314,066 B1
(45) Date of Patent: May 27, 2025

(54) WATER REPLENISHMENT CONTROL METHOD FOR SEMICONDUCTOR PROCESS DEVICE AND SEMICONDUCTOR PROCESS DEVICE

(71) Applicant: BEIJING NAURA MICROELECTRONICS EQUIPMENT CO., LTD., Beijing (CN)

(72) Inventors: Kaiyue Cao, Beijing (CN); Fei Gao, Beijing (CN); Yang Wang, Beijing (CN); Fan Li, Beijing (CN); Hao Yang, Beijing (CN); Zhe Yang, Beijing (CN); Zhihao Ren, Beijing (CN); Qiang Zhang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/869,161

(22) PCT Filed: May 24, 2023

(86) PCT No.: PCT/CN2023/095954
§ 371 (c)(1),
(2) Date: Nov. 25, 2024

(87) PCT Pub. No.: WO2023/231855
PCT Pub. Date: Dec. 7, 2023

(30) Foreign Application Priority Data

May 31, 2022 (CN) .......................... 202210607885.6

(51) Int. Cl.
G05D 7/06 (2006.01)
H01L 21/67 (2006.01)
G05B 19/00 (2006.01)

(52) U.S. Cl.
CPC ..... G05D 7/0629 (2013.01); H01L 21/67017 (2013.01); G05B 19/00 (2013.01);
(Continued)

(58) Field of Classification Search
CPC ............ G05D 7/0629; H01L 21/67017; H01L 21/67057; H01L 21/6704; H01L 21/67086; H01L 21/67155; G05B 19/00
(Continued)

(56) References Cited

U.S. PATENT DOCUMENTS 3,232,317 A * 2/1966 Fowler ................. A01G 25/162
361/164
3,980,093 A * 9/1976 Rhine .................... F02M 41/16
137/624.13
(Continued)

FOREIGN PATENT DOCUMENTS

CN 103194801 A 7/2013
CN 107201549 A 9/2017
(Continued)

OTHER PUBLICATIONS

The World Intellectual Property Organization (WIPO) International Search Report for PCT/CN2023/095954 Jul. 21, 2023 5 Pages (including translation).

Primary Examiner — Minh Q Le
(74) Attorney, Agent, or Firm — ANOVA LAW GROUP, PLLC

(57) ABSTRACT

A water supply control method includes: obtaining water supply time period information that each of the plurality of furnace tubes needs to reserve; according to the water supply time period information that each of the plurality of furnace tubes needs to reserve, updating a reservation queue at a current moment; and according to the water supply time period information in the updated reservation queue, setting the liquid evaporator to be in an available state or an unavailable state for each of the plurality of furnace tubes,
(Continued)

- Obtaining water supply time period information that each of the plurality of furnace tubes needs to reserve — 101
- According to the water supply time period information that each of the plurality of furnace tubes needs to reserve, updating a reservation queue at a current moment — 102
- According to the water supply time period information in the updated reservation queue, setting the liquid evaporator to be in an available state or an unavailable state for each of the plurality of furnace tubes, such that the liquid evaporator supplies water to only one furnace tube at a time — 103 such that the liquid evaporator supplies water to only one furnace tube at a time.

11 Claims, 8 Drawing Sheets

(52) U.S. Cl.
CPC .... *H01L 21/6704* (2013.01); *H01L 21/67057* (2013.01); *H01L 21/67086* (2013.01); *H01L 21/67155* (2013.01)

(58) Field of Classification Search
USPC .......... 137/119.1, 624.18, 1, 487.5; 118/697, 118/702
See application file for complete search history.

(56) References Cited

U.S. PATENT DOCUMENTS

| | | | | |
|---|---|---|---|---|
| 4,092,176 | A | * | 5/1978 | Kozai ............... H01L 21/67051 134/186 |
| 2005/0142010 | A1 | * | 6/2005 | Bailey .................... F04D 25/00 417/423.4 |
| 2005/0147509 | A1 | * | 7/2005 | Bailey ............... H01L 21/67155 417/423.4 |
| 2017/0023922 | A1 | * | 1/2017 | Chandler ........... G05B 19/0426 |
| 2018/0286705 | A1 | * | 10/2018 | Barros ............. H01L 21/67017 |
| 2019/0361832 | A1 | * | 11/2019 | Huang ................. G06F 13/368 |
| 2020/0152488 | A1 | * | 5/2020 | Morita ...................... C02F 1/20 |
| 2021/0008588 | A1 | * | 1/2021 | Ide .................... H01L 21/67017 |
| 2022/0290292 | A1 | * | 9/2022 | Yoshida ................. C23C 16/52 |
| 2022/0365890 | A1 | * | 11/2022 | Huang ............... G06F 13/4282 |
| 2023/0205725 | A1 | * | 6/2023 | Chiu ................... G06F 13/4282 713/503 |

FOREIGN PATENT DOCUMENTS

| | | |
|---|---|---|
| CN | 209658145 U | 11/2019 |
| CN | 113122927 A | 7/2021 |
| CN | 114975183 A | 8/2022 |
| JP | 2002110580 A | 4/2002 |
| TW | 202145127 A | 12/2021 |

* cited by examiner

For each furnace tube, multiple process steps corresponding to the furnace tube are queried sequentially to determine whether any of the multiple process steps is a water supply step according to a process type of the corresponding process step, and determine water replenishment time period information that the corresponding furnace tube needs to reserve according to a process start time and a process end time of the corresponding water supply step ⸺ 201

According to the reservation queue and the water supply time period information that each furnace tube needs to reserve, reservation processing is performed on each furnace tube, and the current reservation queue is updated according to the reservation processing result ⸺ 202

According to the reserved water supply time period information, whether the current time has reached the reserved water supply time period information is determined ⸺ 203

When the current time reaches the scheduled water supply time period information, the liquid evaporator is set to be available for the furnace tube corresponding to the scheduled water supply time period reached at the current time, and is set to be unavailable for the remaining furnace tubes ⸺ 204

When the current time has not reached the reserved water supply time period information, the liquid evaporator is set to be available for each furnace tube ⸺ 205

FIG. 3

| Process step | Process type | Process duration (s) | Start time (s) | End time (s) |
|---|---|---|---|---|
| 1 | no water supply | 60 | 0 | 60 |
| 2 | no water supply | 60 | 60 | 120 |
| 3 | water supply | 600 | 120 | 720 |
| 4 | no water supply | 480 | 720 | 1200 |
| 5 | no water supply | 300 | 1200 | 1500 |
| 6 | water supply | 300 | 1500 | 1800 |
| 7 | no water supply | 1200 | 1800 | 3000 |

FIG. 4

| Furnace tube # | Start time (s) | End time (s) |
|---|---|---|
| 1 | 120 | 720 |
| 1 | 1500 | 1800 |

FIG. 6

| Furnace tube # | Start time (s) | End time (s) |
|---|---|---|
| 1 | 120 | 720 |
| 4 | 900 | 1200 |
| 1 | 1500 | 1800 |
| 3 | 2000 | 2600 |

FIG. 7

| Furnace tube # | Start time (s) | End time (s) |
|---|---|---|
| 1 | 90 | 690 |
| 4 | 870 | 1170 |
| 1 | 1470 | 1770 |
| 3 | 1970 | 2570 |

FIG. 8

| Furnace tube # | Start time (s) | End time (s) |
|---|---|---|
| 4 | 870 | 1170 |
| 3 | 1970 | 2570 |

FIG. 9

WATER REPLENISHMENT CONTROL METHOD FOR SEMICONDUCTOR PROCESS DEVICE AND SEMICONDUCTOR PROCESS DEVICE

CROSS-REFERENCE TO RELATED APPLICATIONS

This application is a national phase entry of PCT Patent Application No. PCT/CN2023/095954, filed on May 24, 2023, which claims the priority of Chinese Patent Application No. 202210607885.6, filed on May 31, 2022, the entire contents of all of which are incorporated herein by reference.

TECHNICAL FIELD

The present disclosure relates to the technical field of semiconductor process technologies and, more particularly, to a water supply control method, a water supply control device, a diffusion process method, a semiconductor process device, and a computer-readable storage medium for semiconductor process device.

BACKGROUND

The price of crystalline silicon solar cell products has dropped significantly, driving the development of low-cost, high-efficiency solar cell technology. Under this situation, an N-pert cell with a double-sided fine grid line structure takes into account the two characteristics of low cost and high efficiency. In the N-pert structure, the formation of the P-N junction and the back field is the key to obtaining a high-efficiency cell. A boron diffusion device is often used to form the P-N junction through boron atom doping.

In the boron diffusion device, each furnace tube often has a bubbling bottle to carry water vapor through nitrogen $N_2$ to achieve a water supply process in a boron diffusion process, and the furnace tubes do not interfere with each other. In order to reduce costs or save device space, some manufacturers use a controlled evaporator mixer (CEM) to replace the bubbling bottle of each furnace tube with multiple furnace tubes sharing one liquid evaporator. During a sharing process of each furnace tube, a water flow rate and a gas flow rate in the liquid evaporator are adjusted according to the number of tubes currently using the liquid evaporator to stabilize the nitrogen $N_2$ and water vapor entering each furnace tube. In order to ensure that the amount of nitrogen $N_2$ and water vapor entering each furnace tube is fixed each time, mutual exclusion of the water supply process among the furnace tubes is implemented to ensure that only one furnace tube uses the liquid evaporator at a time. However, the use time of the liquid evaporator that occupies the furnace tube each time and the number of furnace tubes in the queue are uncertain, resulting in the inability to predict a duration waiting for of each process, resulting in the need for manual monitoring of the process control. Irregular process duration and irregular process waiting will have unpredictable effects on the process results, increase labor costs, substantially affect the stability of the process, and reduce production efficiency.

SUMMARY

In view of the above problems, the embodiments of the present disclosure are proposed to provide a water supply control method, a water supply control device, a diffusion process method, a semiconductor process equipment, and a computer-readable storage medium for the semiconductor process device that overcome the above problems or at least partially solve the above problems.

To solve the above technical problem, one aspect of the present disclosure provides a water supply control method for a semiconductor process device including a liquid evaporator and a plurality of furnace tubes sharing the liquid evaporator. The method includes: obtaining water supply time period information that each of the plurality of furnace tubes needs to reserve; according to the water supply time period information that each of the plurality of furnace tubes needs to reserve, updating a reservation queue at a current moment; and according to the water supply time period information in the updated reservation queue, setting the liquid evaporator to be in an available state or an unavailable state for each of the plurality of furnace tubes, such that the liquid evaporator supplies water to only one furnace tube at a time.

Optionally, obtaining the water supply time period information that each of the plurality of furnace tubes needs to reserve includes: for each of the plurality of furnace tubes, querying multiple process steps corresponding to the corresponding furnace tube sequentially; determining whether any of the multiple process steps is a water supply step according to a process type of each of the multiple process steps; and determining the water supply time period information that each of the plurality of furnace tubes needs to reserve according to a process start time and a process end time of the water supply step.

Optionally, updating the reservation queue according to the water supply time period information that each of the plurality of furnace tubes needs to reserve includes: according to the reservation queue and the water supply time period information that each of the plurality of furnace tubes needs to reserve, performing reservation processing on each of the plurality of furnace tubes; and updating the reservation queue according to a reservation processing result.

Optionally, performing the reservation processing on each of the plurality of furnace tubes according to the reservation queue and the water supply time period information that each of the plurality of furnace tubes needs to reserve and updating the reservation queue according to the reservation processing result includes: determining whether the reservation queue conflicts with the water supply time period information required for reservation of each of the plurality of furnace tubes; in response to the reservation queue conflicting with the water supply time period information required for reservation of each of the plurality of furnace tubes, keeping the reservation queue intact; and in response to the reservation queue not conflicting with any one or more water supply time period information required for reservation of each of the plurality of furnace tubes, adding the water supply time period information required for reservation of each of the plurality of furnace tubes that does not conflict to the reservation queue, and updating the reservation queue.

Optionally, setting the liquid evaporator to be in the available state or the unavailable state for each of the plurality of furnace tubes according to the water supply time period information in the updated reservation queue, such that the liquid evaporator supplies water to only one furnace tube at a time includes: according to the reserved water supply time period information, determining whether a current time reaches the reserved water supply time period information; in response to the current time reaching the reserved water supply time period information, setting the liquid evaporator to be in the available state for the furnace tube corresponding to the reserved water supply time period reached by the current time, and setting the liquid evaporator to be in the unavailable state for the remaining furnace tubes; and in response to the current time not reaching the reserved water supply time period information, setting the liquid evaporator to be in the available state for each of the plurality of furnace tubes.

Optionally, setting the liquid evaporator to be in the available state for the furnace tube corresponding to the reserved water supply time period reached by the current time, and setting the liquid evaporator to be in the unavailable state for the remaining furnace tubes in response to the current time reaching the reserved water supply time period information includes: in response to the current time reaching the reserved water supply time period information, determining whether the liquid evaporator is in an idle state or an occupied state at the current time; in response to the liquid evaporator being in the idle state at the current time, setting the liquid evaporator to be in the available state for the furnace tube corresponding to the reserved water supply time period reached at the current time, and to be in the unavailable state for the remaining furnace tubes; in response to the liquid evaporator being in the occupied state at the current time, determining whether the furnace tube occupying the liquid evaporator is performing manual water supply; in response to the furnace tube occupying the liquid evaporator performing the manual water supply, controlling the furnace tube to release the occupation of the liquid evaporator, setting the furnace tube corresponding to the reserved water supply time period at the current time to be available, and setting the remaining furnace tubes to be unavailable; and in response to the furnace tube occupying the liquid evaporator not performing the manual water supply, waiting for the furnace tube occupying the liquid evaporator to release the liquid evaporator, and when the furnace tube occupying the liquid evaporator ends the occupation of the liquid evaporator, setting the furnace tube corresponding to the reserved water supply time period at the current time to be available, and setting the remaining furnace tubes to be unavailable.

Optionally, setting the liquid evaporator to be in the available state for each of the plurality of furnace tubes in response to the current time not reaching the reserved water supply time period information includes: in response to the current time not reaching the reserved water supply time period information, determining whether the liquid evaporator is in the idle state or in the occupied state at the current time; in response to the liquid evaporator being in the idle state at the current time, setting the liquid evaporator to be available for each of the plurality of furnace tubes, and when a target furnace tube receives a manual water supply instruction, setting the liquid evaporator to be available for the target furnace tube for the manual water supply; in response to the liquid evaporator being in the occupied state at the current time, setting the liquid evaporator to be in the available state for the occupied furnace tube, and setting the liquid evaporator to be in the unavailable state for the remaining furnace tubes, waiting for the furnace tube occupying the liquid evaporator to release the liquid evaporator, ending the occupation of the liquid evaporator by the furnace tube occupying the liquid evaporator, and setting the liquid evaporator to be in the available state for each of the plurality of furnace tubes; and in response to the target furnace tube receiving the manual water supply instruction, setting the liquid evaporator to manually supply the target furnace tube.

Optionally, the method further includes: in response to a process of the furnace tube corresponding to the reserved water supply time period information is terminated due to a fault, removing the reserved water supply time period information of the furnace tube from the reservation queue.

Optionally, the method further includes: in response to the reserved water supply time period information in the reservation queue being empty, and after the target furnace tube receives the water supply instruction, determining whether the target furnace tube is in a process state; in response to the target furnace tube being in the process state, setting the target furnace tube to prohibit water supply; in response to the target furnace tube not being in the process state, determining whether the liquid evaporator is in the available state for the target furnace tube; in response to the liquid evaporator being in the available state for the target furnace tube, setting the target furnace tube to supply water; and in response to the liquid evaporator being in the unavailable state for the target furnace tube, setting the target furnace tube to prohibit water supply.

Another aspect of the present disclosure provides a water supply control device for a semiconductor process device configured to control a liquid evaporator in the semiconductor process device to supply water for each of a plurality of furnace tubes that share the liquid evaporator. The water supply control device includes at least one processor, and at least one memory storing at least one program. When the at least one program is executed by the at least one processor, the at least one processor is configured to perform the disclosed water supply control method.

Another aspect of the present disclosure provides a diffusion process method including multiple process steps. The multiple process steps include a water supply step controlled by the disclosed water supply control method. The diffusion process method includes: in response to the furnace tube executing the process, and a next process step being the water supply step, obtaining an availability state of the corresponding furnace tube; determining whether the liquid evaporator is in the available state for the corresponding furnace tube; in response to the liquid evaporator being in the available state, setting the corresponding furnace tube to jump to the next process step after the current process step is completed; in response to the liquid evaporator being in the unavailable state, setting the corresponding furnace tube to maintain the current process step and wait; and in response to the next process step being not the water supply step, setting the corresponding furnace tube to jump to the next process step after the current process step is completed.

Another aspect of the present disclosure provides a semiconductor process device including a liquid evaporator, a controller, and a plurality of furnace tubes sharing the liquid evaporator. The controller is configured to control the liquid evaporator to supply water to the plurality of furnace tubes, and is configured to perform: obtaining water supply time period information that each of the plurality of furnace tubes needs to reserve; according to the water supply time period information that each of the plurality of furnace tubes needs to reserve, updating a reservation queue at a current moment; and according to the water supply time period information in the updated reservation queue, setting the liquid evaporator to be in an available state or an unavailable state for each of the plurality of furnace tubes, such that the liquid evaporator supplies water to only one furnace tube at a time.

Another aspect of the present disclosure provides a computer-readable storage medium storing a computer program for a semiconductor process device. When being executed by a processor, the computer program implements the disclosed water supply control method.

The embodiments of the present disclosure include the following advantages.

The embodiments of the present disclosure provide a water supply control method, a water supply control device, a diffusion process method, a semiconductor process equipment, and a computer-readable storage medium for the semiconductor process device. The water supply control method includes: obtaining water supply time period information that each of the plurality of furnace tubes needs to reserve; according to the water supply time period information that each of the plurality of furnace tubes needs to reserve, updating a reservation queue at a current moment; and according to the water supply time period information in the updated reservation queue, setting the liquid evaporator to be in an available state or an unavailable state for each of the plurality of furnace tubes, such that the liquid evaporator supplies water to only one furnace tube at a time. The present disclosure obtains the water supply time period information of the furnace tube that needs to be reserved in advance, such that each reserved furnace tube can be supplied in the chronological order, avoiding manual intervention in the process and reducing labor costs, by setting the available state or the unavailable state of the liquid evaporator for each furnace tube. Thus, the liquid evaporator can only be occupied by one furnace tube at a time, reducing the risk of time conflict when multiple furnace tubes occupy the liquid evaporator in the process, minimizing the probability of waiting in the process, and improving production efficiency.

BRIEF DESCRIPTION OF THE DRAWINGS

FIG. 3 is a flowchart of another water supply control method for semiconductor process device according to some embodiments of the present disclosure;

FIG. 4 is time distribution of various process steps of a furnace tube according to some embodiments of the present disclosure;

FIG. 6 shows water supply time period information of a furnace tube calculated by the lower computer according to some embodiments of the present disclosure;

FIG. 7 shows water supply time period information of a furnace tube after a reservation queue is updated according to some embodiments of the present disclosure;

FIG. 8 shows water supply time period information of a reservation queue updated in real time according to some embodiments of the present disclosure;

FIG. 9 shows water supply time period information of a reservation queue updated in real time under abnormal operation conditions according to some embodiments of the present disclosure;

DETAILED DESCRIPTION OF THE EMBODIMENTS

To make the purpose, features and advantages of the present disclosure more obvious and easier to understand, the present disclosure is further described in detail below in conjunction with the accompanying drawings and various embodiments.

In the prior art, to reduce costs and save device space, multiple furnace tubes may share a controlled evaporator mixer (CEM) or a liquid evaporator to replace the bubbling bottle of each furnace tube. At the same time, when the multiple furnace tubes share the liquid evaporator, to ensure that an amount of nitrogen $N_2$ and water vapor introduced into each furnace tube each time is fixed, the mutual exclusion of the water supply stage between the furnace tubes is realized to achieve that only one furnace tube uses the liquid evaporator each time. However, the mutually exclusive waiting time and water supply duration of the water supply stage between the furnace tubes are difficult to be determined, and the end time of water supply of each furnace tube needs to be monitored manually, thereby incurring a substantial labor cost, resulting in inconsistent and unpredictable process results, and reducing production efficiency.

The present disclosure provides a water supply control method for a semiconductor process device. By obtaining the water supply time period information that each furnace tube needs to reserve, and updating a reservation queue according to the obtained water supply time period information, time-sharing of the liquid evaporator by multiple furnace tubes can be achieved.

Figure 1:
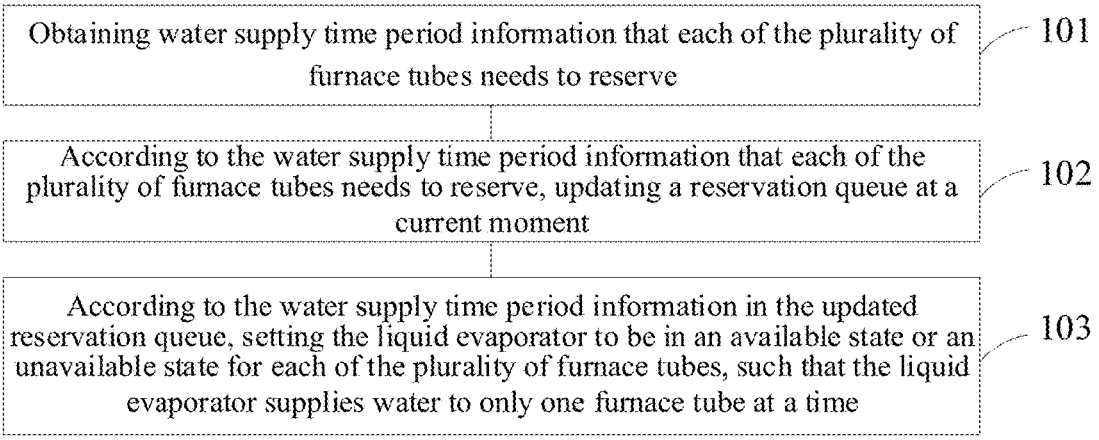
FIG. 1 is a flowchart of a water supply control method for a semiconductor process device according to some embodiments of the present disclosure.

FIG. 1 is a flowchart of a water supply control method for a semiconductor process device according to some embodiments of the present disclosure. The semiconductor process device includes a liquid evaporator and multiple furnace tubes sharing the liquid evaporator. As shown in FIG. 1, the method may include the following processes.

At 101, obtaining water supply time period information that each furnace tube needs to reserve.

Figure 2:
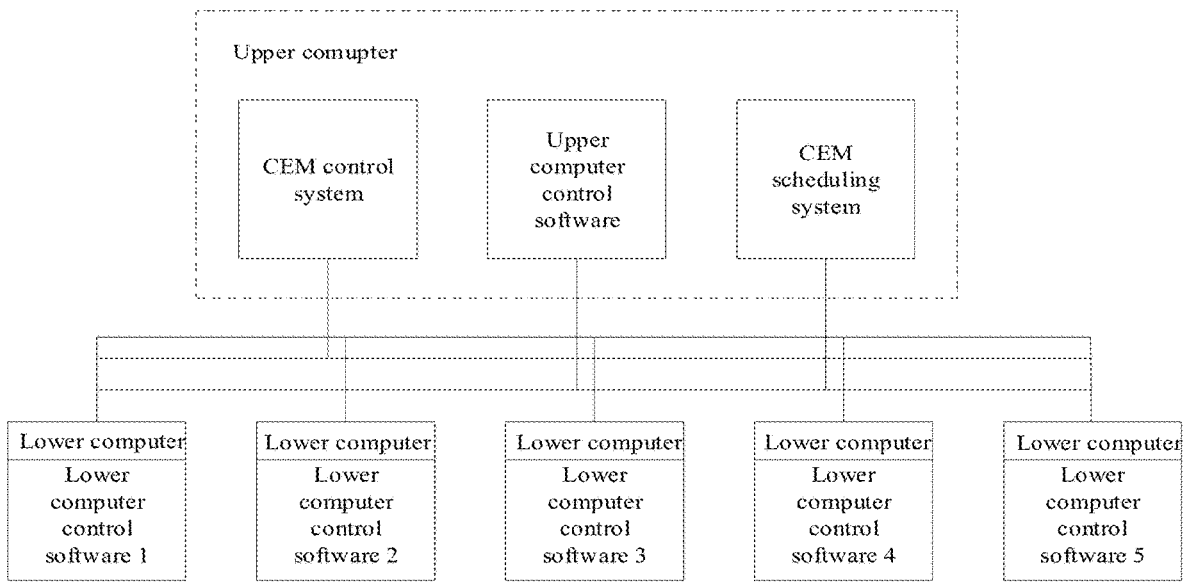
FIG. 2 is a software framework diagram of an upper computer and multiple lower computers according to some embodiments of the present disclosure.

FIG. 2 is a software framework diagram of an upper computer and multiple lower computers according to some embodiments of the present disclosure. In some embodiments, as shown in FIG. 2, the multiple furnace tubes are controlled by corresponding lower computers thereof. The upper computer and the multiple lower computers communicate with each other. The upper computer may include the following three software programs: a liquid evaporator control program, an upper computer control program, and a liquid evaporator scheduling program.

The liquid evaporator control program (also known as the liquid evaporator control system) communicates with the liquid evaporator through a serial port, and includes a programmable logic controller (PLC) to read temperature and flow parameters of the liquid evaporator and provide a liquid evaporator debugging interface for advanced users. The liquid evaporator control program is communicatively connected to the lower computers corresponding to each furnace tube, and is used to provide the lower computers with relevant parameters of the liquid evaporator.

The upper computer control program (also known as the upper computer control system) is connected to the lower computers corresponding to each furnace tube, and is used to provide a user with a device operation interface and to display a current status of each furnace tube in real time.

The liquid evaporator scheduling program (also known as the liquid evaporator scheduling system) is communicatively connected to the lower computers corresponding to each furnace tube, and is used to allocate and manage liquid evaporator resources before a process starts, and to control skipping events and manual water supply events during the process to avoid conflicts in the sharing of the liquid evaporator between the furnace tubes.

Each lower computer includes a lower computer control software, and is connected to the corresponding furnace tube. Each lower computer may obtain time parameters of the water supply time period information of the corresponding furnace tube, and may relay the obtained water supply time period parameters of the corresponding furnace tube to the upper computer for process application before the start of water supply. The lower computer communicates with the liquid evaporator scheduling system to obtain a current status of whether the liquid evaporator is available.

It should be noted that, in general, the number of furnace tubes in the semiconductor process device may be set according to actual needs. For illustration purpose, the number of furnace tubes is 5 in the embodiment of the present disclosure, and the furnace tubes are numbered 1-5.

The lower computer may obtain the water supply time period information that the corresponding furnace tube needs to be reserved and send it to the upper computer. The time period information may be calculated by the lower computer querying a process time of each process step of the furnace tube.

It should be noted that the time period information includes a start time (in unit of second), an end time, and a tube number of each water supply step in the process. The process may be an automatic process or a manual process. The start time and the end time refer to how many seconds remain from a current time. For example, the start time of the water supply step of furnace tube 1 is 90 s, which means that there are 90 seconds remaining to perform this water supply step from the current time, and the end time of the water supply step of furnace tube 1 is 270 s, which means that there are 270 seconds remaining to end this water supply step from the current time.

At 102, according to the water supply time period information that each furnace tube needs to reserve, a current reservation queue is updated.

In some embodiments, the reservation queue refers to a water supply time period queue in the process that has been reserved. When the reservation queue is empty, the upper computer may directly add the water supply time period information that each furnace tube needs to reserve to the reservation queue, and arrange them in an order of the water supply time period information to form an updated reservation queue. The upper computer continuously updates the water supply time period information of the reserved furnace tubes through the lower computer in real time.

When the reservation queue is not empty, the upper computer forms the updated reservation queue by comparing a difference between the reservation queue and the water supply time period information that each furnace tube needs to reserve, and continuously updates the water supply time period information of the reserved furnace tubes through the lower computer in real time.

At 103, according to the reserved water supply time period information in the updated reservation queue, an availability state (available or unavailable) of the liquid evaporator is set for each furnace tube, such that the liquid evaporator can only supply water to one furnace tube at a time.

The liquid evaporator scheduling system in the upper computer may set a state of each furnace tube according to the water supply time period information that has been reserved in the reservation queue. The state may be that the liquid evaporator is available or that the liquid evaporator is unavailable. Then the upper computer may allocate liquid evaporator resources to the furnace tubes according to the availability state of the liquid evaporator for each furnace tube and an order of the water supply time of the corresponding furnace tube in the reservation queue, such that the liquid evaporator resources can only be occupied by one furnace tube at a time.

It should be noted that a preset time for allocating the liquid evaporator in advance in the present disclosure may be set according to user needs and is not limited herein.

In the embodiments of the present disclosure, the water supply time period information that needs to be reserved for each furnace tube is obtained. According to the water supply time period information that needs to be reserved for each furnace tube, the current reservation queue is updated. According to the reserved water supply time period information in the updated reservation queue, the availability state of the liquid evaporator for each furnace tube is set, such that the liquid evaporator can only supply water to one furnace tube at a time. The present disclosure obtains the water supply time period information of the furnace tubes that need to be reserved in advance, such that each reserved furnace tube is supplied with water in a chronological order, thereby avoiding manual intervention in the process. By setting the availability state of the liquid evaporator for each furnace tube, the liquid evaporator can only be occupied by one furnace tube at a time, thereby reducing the risk of time conflict for the occupation of the liquid evaporator by multiple furnace tubes in the process, minimizing the probability of process waiting in the process, reducing labor costs, and improving the production efficiency.

FIG. 3 is a flowchart of another water supply control method for semiconductor process device according to some embodiments of the present disclosure. The semiconductor process device includes a liquid evaporator and multiple furnace tubes sharing the liquid evaporator. The multiple furnace tubes are controlled by corresponding lower computers respectively, and the lower computers communicate with the upper computer. As shown in FIG. 3, the method may include the following processes.

At 201, for each furnace tube, multiple process steps corresponding to the furnace tube are queried sequentially to determine whether any of the multiple process steps is a water supply step according to a process type of the corresponding process step, and determine water supply time period information that the corresponding furnace tube needs to reserve according to a process start time and a process end time of the corresponding water supply step.

In some embodiments, each furnace tube may perform the multiple process steps. FIG. 4 is time distribution of various process steps of a furnace tube according to some embodiments of the present disclosure. As shown in FIG. 4, for example, there are seven process steps for furnace tube 1, and the time distribution of the seven process steps are shown. The serial numbers 1-7 refer to the first process step to the seventh process step. The type of the process steps includes water supply and no water supply. The time refers to a duration of the process step. The start time refers to a time when the process step starts, and the end time refers to a time when the process step ends.

Figure 5:
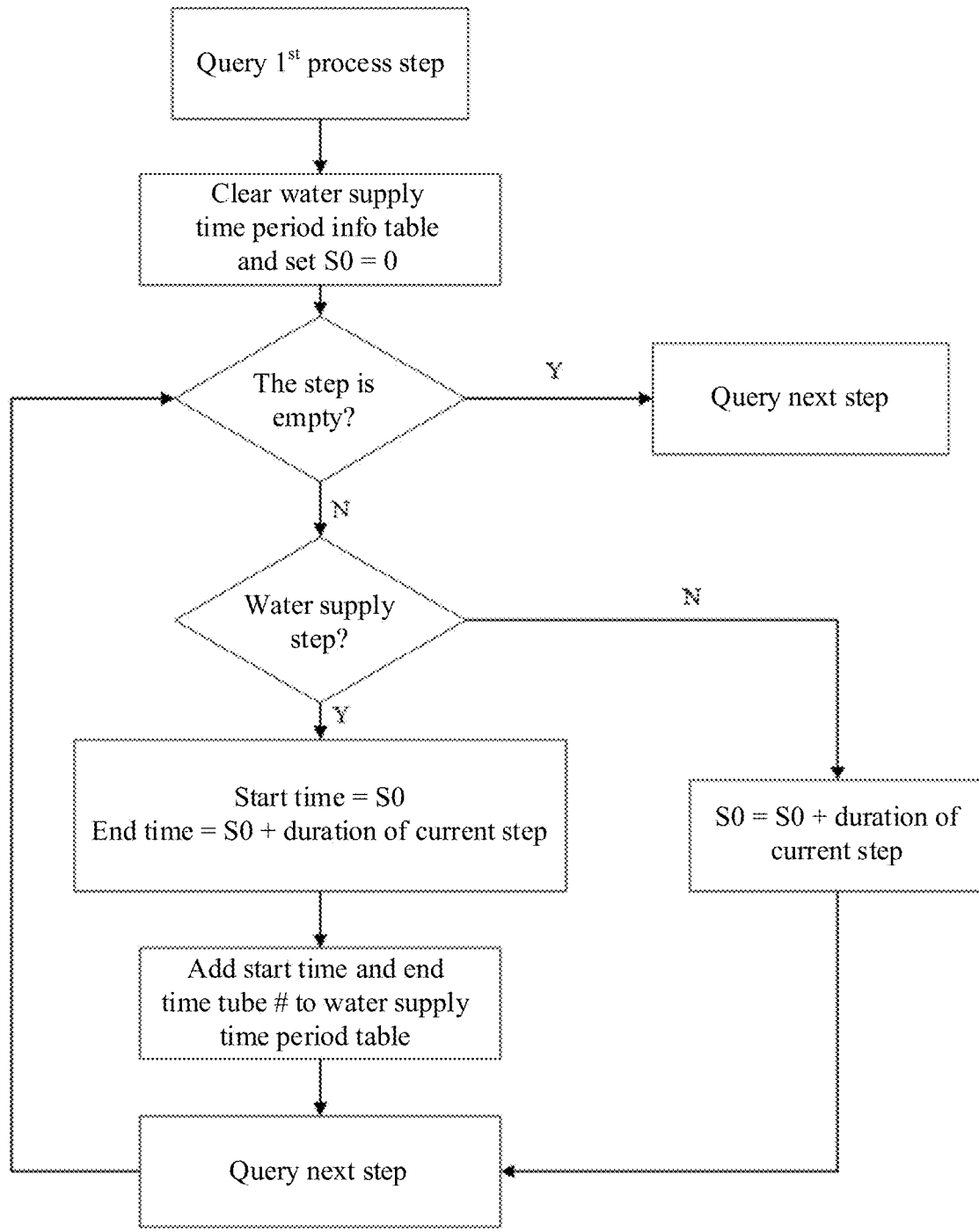
FIG. 5 is a flowchart of determining water supply time periods required for reservation of each furnace tube by the lower computer according to some embodiments of the present disclosure.

FIG. 5 is a flowchart of determining water supply time periods required for reservation of each furnace tube by the lower computer according to some embodiments of the present disclosure. After receiving a process request sent by the upper computer, the lower computer will query each process step of the furnace tube sequentially. As shown in FIG. 5, the lower computer first queries the first process step, clears a water supply time period information table, sets the time accumulation variable S0=0, and determines whether the process step is empty. If it is not empty, the lower computer continues to determine whether the process step is a water supply step. If it is not a water supply step, S0=S0+the process duration of the process step, and the lower computer queries the next process step. If it is a water supply step, the water supply start time is S0, and the water supply end time is S0+the process duration of the process step. The water supply start time, the water supply end time, and the tube number of the water supply step are added to the water supply time period information table. The next process step is queried until all process steps are queried. When the process step is empty, the water supply time period information table of the furnace tube is output, and the lower computer queries the water supply time period information table of all furnace tubes to obtain the water supply time period information that each furnace tube needs to reserve.

In another example, when the lower computer queries the water supply time period information of furnace tube 1, the lower computer first queries the first process step. The process time of this step is 60 s, the first process step is a step that does not require water supply, and the cumulative variable S0=0+60=60 s. Then the second process step is queried. The process time of this step is 60 s, the second process step is also a step that does not require water supply, and the cumulative variable S0=60+60=120 s. Then the third process step is queried. The third process step is a step that requires water supply. The process time of this step is 600 s, the water supply start time=120 s, the water supply end time=S0+600=120+600=720 s, and (furnace tube 1, 120, 720) is added to the water supply time period information table. After querying the seventh step in sequence, the water supply time period information of furnace tube 1 can be obtained, as shown in FIG. 6.

Referring back to FIG. 3, at 202, according to the reservation queue and the water supply time period information that each furnace tube needs to reserve, reservation processing is performed on each furnace tube, and the current reservation queue is updated according to the reservation processing result.

In the embodiments of the present disclosure, there may already be a reservation queue in the upper computer for water supply. After the upper computer receives the water supply time period information that needs to be reserved, the upper computer compares the reservation queue with the water supply time period information that each furnace tube needs to reserve, and reserves the liquid evaporator according to the difference, and updates the reservation queue according to the reservation result.

In some embodiments, 202 may include sub-steps S21 to S23. At sub-step S21, whether the current reservation queue conflicts with the water supply time period information required for reservation of each furnace tube is determined.

At sub-step S22, if the current reservation queue conflicts with the water supply time period information required for reservation of each furnace tube, the current reservation queue does not change.

In one example, it is assumed that the water supply time period information required for reservation of each furnace tube is already in the reservation queue, that is, the water supply time period required for reservation of each furnace tube is occupied. This indicates that the reservation queue conflicts with the water supply time period information required for reservation of each furnace tube, at which time the reservation queue does not change, the lower computer corresponding to the furnace tube does not start the process, the reservation queue does not change, and the lower computer continues to send the water supply time period information required for reservation of the furnace tube to the upper computer until the water supply time period information required for reservation of the furnace tube does not conflict with the reservation queue.

At sub-step S23, if the current reservation queue does not conflict with the water supply time period information that any one or more furnace tubes need to reserve, the water supply time period information that the furnace tubes that do not conflict need to reserve is added to the reservation queue, and the current reservation queue is updated.

In another example, assuming that furnace tubes 3 and 4 are in the reservation queue, furnace tube 1 has two water supply time period information. One of the two water supply time period information of furnace tube 1 is before furnace tube 4, and another one is after furnace tube 4 and furnace tube 3. As such, the water supply time period information that furnace tube 1 needs to supply water does not conflict with the reservation queue, and may be added to the reservation queue for updating. FIG. 7 shows water supply time period information of a furnace tube after a reservation queue is updated according to some embodiments of the present disclosure. At this time, furnace tube 1 may start the process and continuously update the reservation queue in real time according to the progress of the process. For example, when the first process step of furnace tube 1 runs for 30 s, the start time of the first water supply section=the remaining time of the first step 30 s+the process time of the second step 60 s=90 s, and the end time of the first water supply section=the remaining time of the second step 90 s+the process time of the third step 600 s=690 s. That is, the first water supply time period information is updated to (furnace tube 1, 90, 690). Similarly, the second water supply time period information is updated to (furnace tube 1, 1470, 1770). FIG. 8 shows water supply time period information of a reservation queue updated in real time according to some embodiments of the present disclosure.

It should be noted that in the embodiments of the present disclosure, the reservation queue may be continuously updated according to the duration of the process, throughout the entire process.

In some embodiments, the updating of the reservation queue also includes: when the process of the furnace tube corresponding to the reserved water supply time period information is terminated due to a fault, the reserved water supply time period information of the furnace tube is removed from the reservation queue.

In some embodiments, under normal circumstances, the process may occupy (or seize) and release the liquid evaporator according to the reservation queues in FIG. 4 and FIG. 8. However, when an abnormal operation condition occurs, the reservation queue may be processed according to the abnormal operation condition. For example, when furnace tube 1 runs for 30 seconds in the first process step and the entire process is terminated due to an alarm, the upper computer may remove the water supply time period information of the abnormal furnace tube from the reservation queue. FIG. 9 shows water supply time period information of a reservation queue updated in real time under abnormal operation conditions according to some embodiments of the present disclosure.

In another example, when the corresponding furnace tube in the reserved water supply time period information fails, the upper computer sends the status of whether the liquid evaporator is available to each furnace tube in the updated reserved water supply time period information, and allocates the liquid evaporator according to the updated reserved water supply time period information. The upper computer reserves the liquid evaporator for a target furnace tube in advance at a preset time before the liquid evaporator starts to be used, and the liquid evaporator is available for the target furnace tube.

Assuming that the reservation queue of the process in progress is shown in FIG. 8. When the process is terminated after furnace tube 1 has run for 30 s, the upper computer may remove the water supply time period information of furnace tube 1 from the reservation queue. At this time, the reservation queue is updated to the time period information in FIG. 9, that is, the updated reserved water supply time period information. The upper computer sends the status of whether the liquid evaporator is available to furnace tube 4 and furnace tube 3 in the updated reserved water supply time period information. Assuming that both are available, the liquid evaporator is allocated in the order of the time period information. A preset time is allocated before the liquid evaporator starts to operate. The preset time is assumed to be 20 s. The upper computer reserves the liquid evaporator for furnace tube 4 in advance, such that it can be prepared to deal with emergencies such as abnormal process termination in the process, thereby improving the stability of the process.

Referring back to FIG. 3, at 203, according to the reserved water supply time period information, whether the current time has reached the reserved water supply time period information is determined.

Because the water supply start time and end time in the reserved water supply time period refer to the number of seconds left from the current time, the upper computer will determine whether the current time has reached the reserved water supply time period information according to the number of seconds left from the water supply start time.

At 204, when the current time reaches the reserved water supply time period information, the liquid evaporator is set to be available for the furnace tube corresponding to the reserved water supply time period reached at the current time, and is set to be unavailable for the remaining furnace tubes.

When there are 0 s left in the water supply start time, it means that the current time has reached the reserved water supply time period information. The upper computer may set the availability state of the liquid evaporator as available to the furnace tube according to whether there is a furnace tube occupying the liquid evaporator and the reserved water supply time period information, such that the liquid evaporator can only be occupied by one furnace tube at a time.

In some embodiments, 204 may include sub-steps S31 to S35;

At sub-step S31, when the current time reaches the reserved water supply time period information, whether the liquid evaporator is idle or occupied at the current time is determined.

At sub-step S32, if the liquid evaporator is idle at the current time, the liquid evaporator is set to be available for the furnace tube corresponding to the reserved water supply time period at the current time, and is set to be unavailable for the remaining furnace tubes.

If the liquid evaporator is idle at the current time, it means that no furnace tube occupies the liquid evaporator, the upper computer sets the liquid evaporator to be available for the furnace tube corresponding to the reserved water supply time period in the reservation queue, and sets the liquid evaporator to be unavailable for the remaining furnace tubes. That is, the furnace tube corresponding to the reserved water supply time period that has not arrived is set to be unavailable, and the furnace tubes in the reservation queue are supplied in the chronological order. For example, as shown in FIG. 8, the furnace tubes are supplied in the order of furnace tube 1, furnace tube 4, furnace tube 1, and furnace tube 3.

At sub-step S33, if the liquid evaporator is currently occupied, whether the furnace tube occupying the liquid evaporator is manually supplying water is determined.

In the embodiments of the present disclosure, water supply may be divided into automatic water supply and manual control water supply. If the liquid evaporator is currently occupied, it means that a furnace tube is using the liquid evaporator for water supply. At this time, water supply is performed according to a process priority order, and it is determined whether the occupied furnace tube is a manually controlled supply furnace tube.

At sub-step S34, if the furnace tube occupying the liquid evaporator is manually supplying water, the furnace tube is controlled to release the occupation of the liquid evaporator, and the liquid evaporator is set to be available for the furnace tube corresponding to the reserved supply time period at the current time, and is set to be unavailable for the remaining furnace tubes.

If the occupied furnace tube is manually supplying water, the manually occupied furnace tube directly stops supplying water, cancels an occupied state of the liquid evaporator, follows the principle of priority of the process reservation queue, and sets the liquid evaporator to be available for the reserved furnace tube in the reservation queue. At this time, the furnace tubes in the reservation queue may be supplied according to the reservation order, and the specific order is not repeated here. The furnace tubes that have not been successfully reserved are set to be unavailable, and the furnace tubes that have not been successfully reserved are prohibited from supplying water.

At sub-step S35, if the furnace tube occupying the liquid evaporator is not manually supplying water, the furnace tube occupying the liquid evaporator is waited for releasing the liquid evaporator. When the furnace tube occupying the liquid evaporator ends the occupation of the liquid evaporator, the furnace tube corresponding to the reserved supply time period at the current time is set to be available, and the remaining furnace tubes are set to be unavailable.

In one example, it is assumed that furnace tube 2 is occupied and the liquid evaporator is being used for automatic water supply. At this time, when the upper computer waits for the completion of water supply of furnace tube 2. That is, when the occupation of the liquid evaporator is terminated, the liquid evaporator is set to be available for the furnace tube corresponding to the reserved water supply time period at the current time. At this time, the furnace tube corresponding to the reserved water supply time period in the reservation queue may be supplied in accordance with the reservation order, and the specific order is not repeated herein. The furnace tube corresponding to the reserved water supply time period that has not arrived is set to be unavailable, and the furnace tube corresponding to the reserved water supply time period that has not arrived is prohibited from supplying water.

Referring back to FIG. 3, at 205, when the current time has not reached the reserved water supply time period information, the liquid evaporator is set to be available for each furnace tube.

When the water supply start time is not 0, it means that the current time has not reached the reserved water supply time period information. The upper computer may control the liquid evaporator to manually supply water according to whether there is a furnace tube occupying the liquid evaporator and the reserved water supply time period information, and when preset requirements are met, such that the liquid evaporator can only be occupied by one furnace tube at a time.

In some embodiments, step 205 may include sub-steps S41-S43.

At sub-step S41, when the current time has not reached the reserved water supply time period information, whether the liquid evaporator is idle or occupied at the current time is determined.

At sub-step S42, if the liquid evaporator is idle at the current time, the liquid evaporator is set to be available for each furnace tube, and when the target furnace tube receives a manual water supply instruction, the liquid evaporator is set to manually supply the target furnace tube.

In the embodiments of the present disclosure, the target furnace tube refers to the furnace tube specified by the user. In one example, if the liquid evaporator is idle at the current time, it means that at the current time, the liquid evaporator can manually controlled for water supply for each furnace tube. At this time, the upper computer sets the liquid evaporator to be available for each furnace tube, and may manually control the water supply for any furnace tube in the multiple furnace tubes according to user needs, regardless of whether the reservation is successful.

At sub-step S43, if the liquid evaporator is in the occupied state at the current time, the liquid evaporator is set to be available for the occupied furnace tube, and the liquid evaporator is set to be unavailable for the remaining furnace tubes. The furnace tube occupying the liquid evaporator is waited for releasing the liquid evaporator. When the furnace tube occupying the liquid evaporator ends the occupation of the liquid evaporator, the liquid evaporator is set to be available for each furnace tube. When the target furnace tube receives the manual water supply instruction, the liquid evaporator is set to manually supply water for the target furnace tube.

If the liquid evaporator is in the occupied state at the current time, due to the principle of process priority, the liquid evaporator is set to be available for the occupied furnace tube, and the liquid evaporator is set to be unavailable for the remaining furnace tubes. When the furnace tube occupying the liquid evaporator ends the occupation of the liquid evaporator, that is, the furnace tube occupying the liquid evaporator releases the liquid evaporator. The upper computer may set the liquid evaporator to be available for each furnace tube, and may manually control the water supply of any furnace tube in the multiple furnace tubes according to user needs, regardless of whether the reservation is successful.

In some embodiments, the method further includes: when the reserved water supply time period information in the reservation queue is empty, and after the target furnace tube receives the water supply instruction, determining whether the target furnace tube is in a process state; if it is in the process state, setting the target furnace tube to prohibit water supply; if it is not in the process state, determining whether the liquid evaporator is in the available state for the target furnace tube; if it is in the available state, setting the target furnace tube to supply water; and if it is in the unavailable state, setting the target furnace tube to prohibit water supply.

Figure 10:
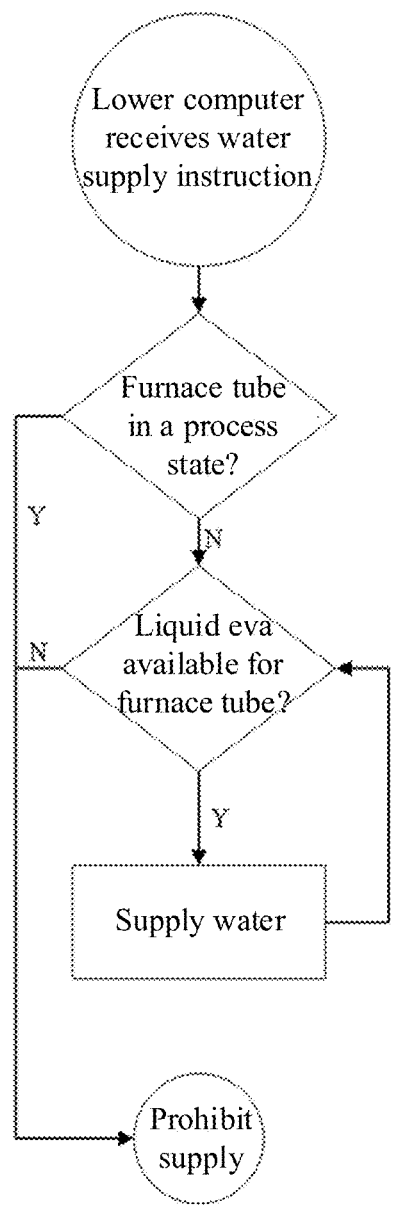
FIG. 10 is a flowchart of performing process skipping by the lower computer according to some embodiments of the present disclosure.

FIG. 10 is a flowchart of performing process skipping by the lower computer according to some embodiments of the present disclosure. In the current time period, the reservation queue is empty, and the liquid evaporator is available to all furnace tubes at this moment. After the lower computer receives the water supply instruction sent by the upper computer, to protect personal safety, it must be ensured that the manual control of water supply is performed without the process. Therefore, it is first determined whether the current furnace tube is in the process state. If the current furnace tube is in the process state, water supply is prohibited. If the current furnace tube is not in the process state, it is determined whether the liquid evaporator is available to the furnace tube. If it is available, the lower computer controls the corresponding furnace tube to supply water. If it is not available, the lower computer controls the corresponding furnace tube to prohibit water supply until the liquid evaporator is available to the furnace tube and the lower computer controls the corresponding furnace tube to supply water.

It should be noted that because manual water supply belongs to uncontrollable time, the liquid evaporator scheduling system may directly set the entire time period 0-32767 s as the water supply time period. The water supply time period may be set according to user needs. During this time period, the liquid evaporator is available for manual water supply of the furnace tube, but unavailable for other furnace tubes. Other furnace tubes may be manually supplied with water. Because the process priority is the highest, this time period may not affect the water supply in the process. When the reservation queue is not empty, the manual water supply furnace tube will release the liquid evaporator resources in time.

Figure 11:
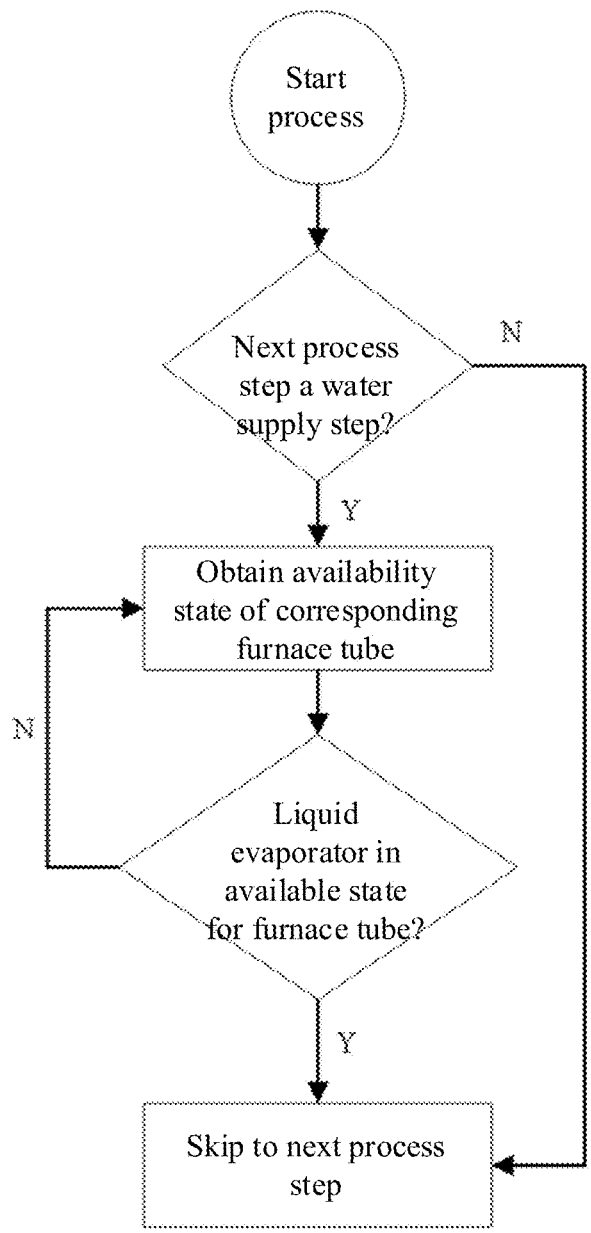
FIG. 11 is a flowchart of performing a diffusion process according to some embodiments of the present disclosure.

FIG. 11 is a flowchart of performing a diffusion process according to some embodiments of the present disclosure. As shown in FIG. 11, the diffusion process method includes multiple process steps, and the multiple process steps include a water supply step. The water supply step is controlled by the water supply control method. The diffusion process method includes the following processes.

At S301, when the furnace tube executes the process, if the next process step is a water supply step, the availability state of the corresponding furnace tube is obtained.

At S302, whether the liquid evaporator is in an available state for the corresponding furnace tube is determined.

At S303, if it is in an available state, the corresponding furnace tube is set to jump to the next process step after the current process step is completed; if it is in an unavailable state, the corresponding furnace tube is set to maintain the current process step and wait.

At S304, if the next process step is not a water supply step, the corresponding furnace tube is set to jump to the next process step after the current process step is completed.

In the embodiments of the present disclosure, when a furnace tube performs a diffusion process step, if the next step is a water supply step, the lower computer obtains the availability state of the liquid evaporator of the furnace tube from the liquid evaporator scheduling system, and allows the step to be skipped only when it is available. Otherwise it maintains the state before skipping the step, and continues to obtain the availability state of the liquid evaporator of the furnace tube from the liquid evaporator scheduling system until the liquid evaporator is available for the furnace tube and jumps to the next step. If the next step is not a water supply step, it directly jumps to the next process step.

In the embodiments of the present disclosure, the water supply time period information that needs to be reserved for each furnace tube is obtained. The reservation queue is updated according to the reservation queue and the water supply time period information that needs to be reserved for each furnace tube. According to the reserved water supply time period information in the reservation queue, the available state or unavailable state of the liquid evaporator for each furnace tube is set, such that the liquid evaporator can only be occupied by one furnace tube at a time. The present disclosure obtains the water supply time period information of the furnace tubes that need to be reserved in advance, such that each reserved furnace tube is supplied with water in the chronological order, thereby avoiding manual intervention in the process. By setting the available state or unavailable state of the liquid evaporator for each furnace tube, the liquid evaporator can only be occupied by one furnace tube at a time, thereby reducing the risk of time conflict for the occupation of the liquid evaporator by multiple furnace tubes in the process, minimizing the probability of process waiting in the process, reducing labor costs, and improving the production efficiency.

It should be noted that, for the method embodiments, for the sake of simplicity, they are all expressed as a series of action combinations. But those skilled in the art should know that the embodiments of the present disclosure are not limited by the described action sequence. Because according to the embodiments of the present disclosure, some steps may be performed in other sequences or simultaneously. Further, those skilled in the art should also know that the embodiments described in the specification are all preferred embodiments, and the actions involved are not necessarily required by the embodiments of the present disclosure.

Figure 12:
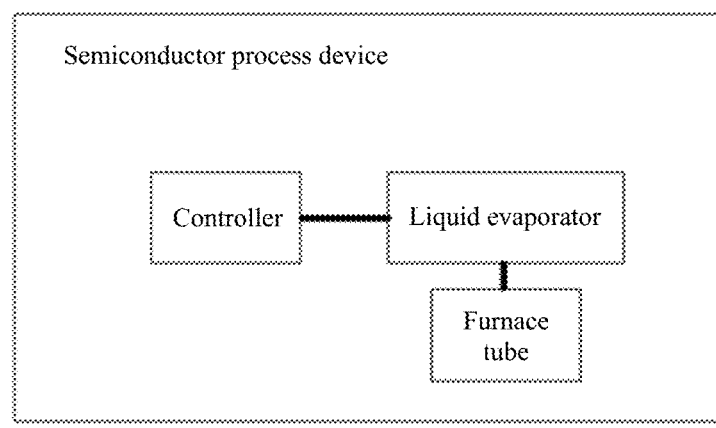
FIG. 12 is a structural block diagram of a semiconductor process device according to some embodiments of the present disclosure.

FIG. 12 is a structural block diagram of a semiconductor process device according to some embodiments of the present disclosure. As shown in FIG. 12, the semiconductor process device includes a liquid evaporator, a controller, and a plurality of furnace tubes sharing the liquid evaporator. The controller is configured to control the liquid evaporator to supply water to each of the plurality of furnace tubes, and is configured to: obtain the water supply time period information that each furnace tube needs to reserve; according to the water supply time period information that each furnace tube needs to reserve, update the current reservation queue; according to the reserved water supply time period information in the updated reservation queue, set the available state or unavailable state of the liquid evaporator to each of the plurality of furnace tubes, such that the liquid evaporator only supplies water to one furnace tube at a time.

In some embodiments, the controller is also configured to: query the multiple process steps corresponding to each furnace tube sequentially; determine whether any process step is a water supply step according to the process type of the corresponding process step; and determine the water supply time period information that the corresponding furnace tube needs to reserve according to the process start time and end time of the water supply step.

In some embodiments, the controller is further configured to perform the reservation processing on each furnace tube according to the reservation queue and the water supply time period information that each furnace tube needs to reserve; and update the current reservation queue according to the reservation processing result.

In some embodiments, the controller is further configured to determine whether the current reservation queue conflicts with the water supply time period information that each furnace tube needs to reserve. If the current reservation queue conflicts with the water supply time period information that each furnace tube needs to reserve, the current reservation queue does not change. If the current reservation queue does not conflict with any one or more water supply time period information that the furnace tube needs to reserve, the water supply time period information that does not conflict with the furnace tube needs to reserve is added to the reservation queue, and the current reservation queue is updated.

In some embodiments, the controller is further configured to determine whether the current time reaches the reserved water supply time period information according to the reserved water supply time period information.

When the current time reaches the reserved water supply time period information, the liquid evaporator is set to be in the available state for the furnace tube corresponding to the reserved water supply time period reached at the current time, and is set to be in the unavailable state for the remaining furnace tubes. When the current time does not reach the reserved water supply time period information, the liquid evaporator is set to be in the available state for each furnace tube.

In some embodiments, the controller is further configured to determine whether the liquid evaporator is in the idle state or the occupied state at the current time when the current time reaches the reserved water supply time period information.

If the liquid evaporator is in the idle state at the current time, the liquid evaporator is set to be in the available state for the furnace tube corresponding to the reserved water supply time period reached at the current time, and is set to be in the unavailable state for the remaining furnace tubes. If the liquid evaporator is in the occupied state at the current time, whether the corresponding furnace tube occupying the liquid evaporator is performing manual water supply is determined.

If the corresponding furnace tube occupying the liquid evaporator is performing manual water supply, the corresponding furnace tube releases the occupation of the liquid evaporator, and the liquid evaporator is set to be in the available state for the furnace tube corresponding to the reserved water supply time period arriving at the current time, and is set to be in the unavailable state for the remaining furnace tubes.

If the furnace tube occupying the liquid evaporator is not performing manual water supply, the furnace tube occupying the liquid evaporator is waited for releasing the liquid evaporator. When the furnace tube occupying the liquid evaporator ends the occupation of the liquid evaporator, the liquid evaporator is set to be in the available state for the furnace tube corresponding to the reserved water supply time period arriving at the current time, and is set to in the unavailable state for the remaining furnace tubes.

In some embodiments, the controller is further configured to determine whether the liquid evaporator is idle or occupied at the current time when the current time does not reach the reserved water supply time period information.

If the liquid evaporator is idle at the current time, the liquid evaporator is set to be available for each of the plurality of furnace tubes. When the target furnace tube receives a manual water supply instruction, the liquid evaporator is set to manually supply water for the target furnace tube.

If the liquid evaporator is occupied at the current time, the liquid evaporator is set to be available for the occupied furnace tube. The liquid evaporator is set to be unavailable for the remaining furnace tubes. The furnace tube occupying the liquid evaporator is waited for releasing the liquid evaporator. After the furnace tube occupying the liquid evaporator ends the occupation of the liquid evaporator, and when the target furnace tube receives the manual water supply instruction, the liquid evaporator is set to manually supply water for the target furnace tube.

In some embodiments, the controller is further configured to remove the reserved water supply time period information of the furnace tube from the reservation queue when the process of the furnace tube corresponding to the reserved water supply time period information is terminated due to a fault.

In some embodiments, the controller is further configured to determine whether the target furnace tube is in the process state when the reserved water supply time period information in the reservation queue is empty and after the target furnace tube receives the water supply instruction. If it is in the process state, the target furnace tube is set to prohibit water supply. If it is not in the process state, whether the liquid evaporator is in the available state for the target furnace tube is determined. If it is in the available state, the target furnace tube is set to supply water. If it is in the unavailable state, the target furnace tube is set to prohibit water supply.

In some embodiments, the controller is further configured to obtain the availability state of the corresponding furnace tube when the furnace tube executes the process. If the next process step is the water supply step, whether the liquid evaporator is in then available state for the corresponding furnace tube is determined. If it is in the available state, the corresponding furnace tube is set to jump to the next process step after the current process step is completed. If it is in the unavailable state, the corresponding furnace tube is set to maintain the current process step and wait. If the next process step is not the water supply step, the corresponding furnace tube is set to jump to the next process step after the current process step is completed.

The embodiments of the present disclosure disclose the semiconductor process device, which includes the liquid evaporator, the controller, and the plurality of furnace tubes sharing the liquid evaporator. The controller is configured to: obtain the water supply time period information that each furnace tube needs to reserve; update the current reservation queue according to the water supply time period information that each furnace tube needs to reserve; set the available state or unavailable state of the liquid evaporator for each furnace tube according to the reserved water supply time period information in the updated reservation queue, such that the liquid evaporator only supplies water to one furnace tube at a time. The present disclosure obtains the water supply time period information of the furnace tube that needs to be reserved in advance, such that each reserved furnace tube supplies water in the chronological order, avoids excessive manual intervention in the process and reduces labor costs, sets the available state or unavailable state of the liquid evaporator for each furnace tube, such that the liquid evaporator can only be occupied by one furnace tube at a time, reduces the risk of time conflict when multiple furnace tubes occupy the liquid evaporator in the process, minimizes the probability of process waiting in the process, and improves the production efficiency.

For the device embodiment, since it is basically similar to the method embodiment, the description is relatively simple, and the relevant parts can be referred to the relevant description of the method embodiments.

Figure 13:
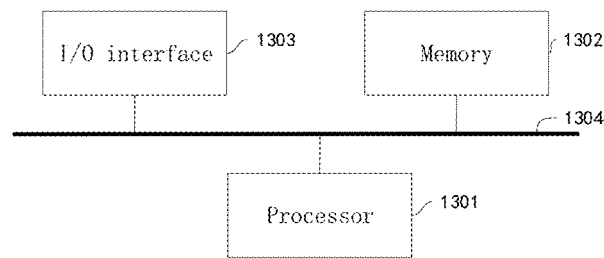
FIG. 13 is a structural block diagram of a water supply control device of a semiconductor process device according to some embodiments of the present disclosure.

FIG. 13 is a structural block diagram of a water supply control device of a semiconductor process device according to some embodiments of the present disclosure. As shown in FIG. 13, the water supply control device is configured to control the liquid evaporator in the semiconductor process device to supply water to each furnace tube of the shared liquid evaporator. The water supply control device includes: at least one processor 1301, a memory 1302, and at least one I/O interface 1303. The memory 1302 stores at least one program. When the at least one program is executed by the at least one processor 1301, the at least one processor implements the steps in any control method in the above embodiments. The at least one I/O interface 1303 is connected between the at least one processor 1301 and the memory 1302, and is configured to implement information interaction between the at least one processor 1301 and the memory 1302.

The at least one processor 1301 may be a device with data processing capability, including but not limited to a central processing unit (CPU), etc.

The memory 1302 may be a device with data storage capability, including but not limited to a random-access memory (RAM, more specifically, SDRAM, DDR, etc.), a read-only memory (ROM), an electrically erasable programmable read-only memory (EEPROM), and a flash memory (FLASH).

The at least one I/O interface (read-write interface) 1303 is connected between the at least one processor 1301 and the memory 1302, and may achieve information interaction between the at least one processor 1301 and the memory 1302. The at least one I/O interface includes but is not limited to a data bus (Bus), etc.

In some embodiments, the at least one processor 1301, the memory 1302, and the at least one I/O interface 1303 are interconnected through the bus 104, and then connected to other components of a computing device.

In some embodiments, the at least one processor 1301 includes an FPGA.

The present disclosure also provides a computer-readable medium. The computer-readable medium stores a computer program. When being executed by a processor, the computer program implements the steps in any control method of the above-mentioned embodiments.

In particular, according to the embodiments of the present disclosure, the process described above with reference to the flowcharts can be implemented as a computer software program. For example, the embodiment of the present disclosure includes a computer program product, which includes a computer program stored on a machine-readable medium. The computer program contains a program code for executing the method shown in the flowcharts. In such embodiments, the computer program may be downloaded and installed from a network through a communication interface, and/or installed from a removable medium. When the computer program is executed by a central processing unit (CPU), the above-mentioned functions defined in the system of the present disclosure are executed.

It should be noted that the computer-readable medium shown in the present disclosure may be a computer-readable signal medium or a computer-readable storage medium or any combination of the above two. The computer-readable storage medium may be, for example, but not limited to, an electrical, magnetic, optical, electromagnetic, infrared, or semiconductor system, device or device, or any combination thereof. More specific examples of computer-readable storage media may include, but are not limited to: an electrical connection with one or more wires, a portable computer disk, a hard disk, a random-access memory (RAM), a read-only memory (ROM), an erasable programmable read-only memory (EPROM or flash memory), an optical fiber, a portable compact disk read-only memory (CD-ROM), an optical storage device, a magnetic storage device, or any suitable combination thereof. In the present disclosure, the computer-readable storage medium may be any tangible medium containing or storing a program that can be used by or in combination with an instruction execution system or device. In the present disclosure, the computer-readable signal medium may include a data signal propagated in a baseband or as part of a carrier wave, in which a computer-readable program code is carried. This propagated data signal may take a variety of forms, including but not limited to electromagnetic signals, optical signals, or any suitable combination thereof. The computer-readable signal medium may also be any computer-readable medium other than the computer-readable storage medium, which may send, propagate or transmit a program for use by or in conjunction with an instruction execution system or device. The program code contained on the computer-readable medium may be transmitted by any appropriate medium, including but not limited to: wireless, wire, optical cable, RF, etc., or any suitable combination thereof.

The flowcharts and block diagrams in the accompanying drawings illustrate the possible implementation architecture, functions and operations of the systems, methods and computer program products according to various embodiments of the present disclosure. In this regard, each box in the flowchart or block diagram may represent a module, a program segment, or a portion of the code, and the aforementioned module, program segment, or a portion of the code contains one or more executable instructions for implementing the specified logical functions. It should also be noted that in some alternative implementations, the functions marked in the box may also occur in a different order than that marked in the accompanying drawings. For example, two boxes represented in succession may actually be executed substantially in parallel, and they may sometimes be executed in reverse order, depending on the functions involved. It should also be noted that each box in the block diagram and/or flowchart, and combinations of boxes in the block diagram and/or flowchart, can be implemented by a dedicated hardware-based system that performs the specified function or operation, or can be implemented by a combination of dedicated hardware and computer instructions.

Each embodiment in this specification is described in a progressive manner, and each embodiment focuses on the differences from other embodiments. The same or similar parts between the embodiments can be referred to each other.

Those skilled in the art should understand that the embodiments of the present disclosure can be provided as methods, devices, or computer program products. Therefore, the embodiments of the present disclosure can be in the form of a complete hardware embodiment, a complete software embodiment, or an embodiment combining software and hardware.

Moreover, the embodiments of the present disclosure can be in the form of the computer program product implemented on one or more computer-usable storage media (including but not limited to disk storage, CD-ROM, optical storage, etc.) containing the computer-usable program codes.

The embodiments of the present disclosure are described with reference to the flowcharts and/or block diagrams of the methods, terminal devices (systems), and computer program products according to the embodiments of the present disclosure. It should be understood that each process and/or box in the flowchart and/or block diagram, as well as the combination of processes and/or boxes in the flowchart and/or block diagram, can be implemented by computer program instructions. These computer program instructions may be provided to a processor of a general-purpose computer, a special-purpose computer, an embedded processor, or other programmable data processing terminal device to produce a machine, such that the instructions executed by the processor of the computer or other programmable data processing terminal device produce a device for implementing the functions specified in one or more processes of the flowchart and/or one or more blocks of the block diagram. These computer program instructions may also be stored in the computer-readable memory that can guide a computer or other programmable data processing terminal device to work in a specific manner, such that the instructions stored in the computer-readable memory produce a product including an instruction device, which implements the functions specified in one or more processes of the flowchart and/or one or more blocks of the block diagram.

These computer program instructions may also be loaded onto a computer or other programmable data processing terminal device, such that a series of operation steps are performed on the computer or other programmable terminal device to produce a computer-implemented process, such that the instructions executed on the computer or other programmable terminal device provide steps for implementing the functions specified in one or more processes of the flowchart and/or one or more blocks of the block diagram.

Although the preferred embodiments of the present invention have been described, those skilled in the art may make additional changes and modifications to these embodiments once they are aware of the basic creative concepts. Therefore, the appended claims are intended to be interpreted as including the preferred embodiment and all changes and modifications that fall within the scope of the embodiments of the present disclosure.

Finally, it should be noted that, in this specification, relational terms such as first and second, etc. are only used to distinguish one entity or operation from another entity or operation, and do not necessarily require or imply any such actual relationship or order between these entities or operations. Moreover, the terms "include", "comprise" or any other variants thereof are intended to cover non-exclusive inclusion, such that a process, method, article or terminal device including a series of elements includes not only those elements, but also other elements not explicitly listed, or also includes elements inherent to such process, method, article or terminal device. In the absence of more restrictions, the elements defined by the sentence "including one . . . " do not exclude the existence of other identical elements in the process, method, article or terminal device including the elements.

The above is a detailed introduction to the water supply control method, the diffusion process method, and the semiconductor process device provided by the present disclosure. Specific examples are used in this specification to illustrate the principles and implementation methods of the present disclosure. The description of the above embodiments is merely used to help understand the method of the present disclosure and its core idea. At the same time, for general technical personnel in this field, according to the idea of the present disclosure, there will be changes and modifications in the specific implementation method and application scope. Thus, the content of this specification should not be understood as a limitation on the present disclosure.

What is claimed is:

1. A water supply control method for a semiconductor process device including a liquid evaporator and a plurality of furnace tubes sharing the liquid evaporator, the method comprising:
   obtaining water supply time period information that each of the plurality of furnace tubes needs to reserve;
   according to the water supply time period information that each of the plurality of furnace tubes needs to reserve, updating a reservation queue at a current moment; and
   according to the water supply time period information in the updated reservation queue, setting the liquid evaporator to be in an available state or an unavailable state for each of the plurality of furnace tubes, such that the liquid evaporator supplies water to only one furnace tube at a time.

2. The method according to claim 1, wherein obtaining the water supply time period information that each of the plurality of furnace tubes needs to reserve comprises:
   for each of the plurality of furnace tubes, querying multiple process steps corresponding to the corresponding furnace tube sequentially;
   determining whether any of the multiple process steps is a water supply step according to a process type of each of the multiple process steps; and
   determining the water supply time period information that each of the plurality of furnace tubes needs to reserve according to a process start time and a process end time of the water supply step.

3. The method according to claim 1, wherein updating the reservation queue according to the water supply time period information that each of the plurality of furnace tubes needs to reserve comprises:
   according to the reservation queue and the water supply time period information that each of the plurality of furnace tubes needs to reserve, performing reservation processing on each of the plurality of furnace tubes; and
   updating the reservation queue according to a reservation processing result.

4. The method according to claim 3, wherein performing the reservation processing on each of the plurality of furnace tubes according to the reservation queue and the water supply time period information that each of the plurality of furnace tubes needs to reserve and updating the reservation queue according to the reservation processing result comprises:
   determining whether the reservation queue conflicts with the water supply time period information required for reservation of each of the plurality of furnace tubes;
   in response to the reservation queue conflicting with the water supply time period information required for reservation of each of the plurality of furnace tubes, keeping the reservation queue intact; and
   in response to the reservation queue not conflicting with any one or more water supply time period information required for reservation of each of the plurality of furnace tubes, adding the water supply time period information required for reservation of each of the plurality of furnace tubes that does not conflict to the reservation queue, and updating the reservation queue.

5. The method according to claim 1, wherein setting the liquid evaporator to be in the available state or the unavailable state for each of the plurality of furnace tubes according to the water supply time period information in the updated reservation queue, such that the liquid evaporator supplies water to only one furnace tube at a time comprises:
   according to the reserved water supply time period information, determining whether a current time reaches the reserved water supply time period information;
   in response to the current time reaching the reserved water supply time period information, setting the liquid evaporator to be in the available state for the furnace tube corresponding to the reserved water supply time period reached by the current time, and setting the liquid evaporator to be in the unavailable state for the remaining furnace tubes; and
   in response to the current time not reaching the reserved water supply time period information, setting the liquid evaporator to be in the available state for each of the plurality of furnace tubes.

6. The method according to claim 5, wherein setting the liquid evaporator to be in the available state for the furnace tube corresponding to the reserved water supply time period reached by the current time, and setting the liquid evaporator to be in the unavailable state for the remaining furnace tubes in response to the current time reaching the reserved water supply time period information comprises:
   in response to the current time reaching the reserved water supply time period information, determining whether the liquid evaporator is in an idle state or an occupied state at the current time;
   in response to the liquid evaporator being in the idle state at the current time, setting the liquid evaporator to be in the available state for the furnace tube corresponding to the reserved water supply time period reached at the current time, and to be in the unavailable state for the remaining furnace tubes;
   in response to the liquid evaporator being in the occupied state at the current time, determining whether the furnace tube occupying the liquid evaporator is performing manual water supply;
   in response to the furnace tube occupying the liquid evaporator performing the manual water supply, controlling the furnace tube to release the occupation of the liquid evaporator, setting the furnace tube corresponding to the reserved water supply time period at the current time to be available, and setting the remaining furnace tubes to be unavailable; and
   in response to the furnace tube occupying the liquid evaporator not performing the manual water supply, waiting for the furnace tube occupying the liquid evaporator to release the liquid evaporator, and when the furnace tube occupying the liquid evaporator ends the occupation of the liquid evaporator, setting the furnace tube corresponding to the reserved water supply time period at the current time to be available, and setting the remaining furnace tubes to be unavailable.

7. The method according to claim 5, wherein setting the liquid evaporator to be in the available state for each of the plurality of furnace tubes in response to the current time not reaching the reserved water supply time period information comprises:

in response to the current time not reaching the reserved water supply time period information, determining whether the liquid evaporator is in the idle state or in the occupied state at the current time;

in response to the liquid evaporator being in the idle state at the current time, setting the liquid evaporator to be available for each of the plurality of furnace tubes, and when a target furnace tube receives a manual water supply instruction, setting the liquid evaporator to be available for the target furnace tube for the manual water supply;

in response to the liquid evaporator being in the occupied state at the current time, setting the liquid evaporator to be in the available state for the occupied furnace tube, and setting the liquid evaporator to be in the unavailable state for the remaining furnace tubes, waiting for the furnace tube occupying the liquid evaporator to release the liquid evaporator, ending the occupation of the liquid evaporator by the furnace tube occupying the liquid evaporator, and setting the liquid evaporator to be in the available state for each of the plurality of furnace tubes; and in response to the target furnace tube receiving the manual water supply instruction, setting the liquid evaporator to manually supply the target furnace tube.

8. The method according to claim 1, further comprising:
in response to a process of the furnace tube corresponding to the reserved water supply time period information is terminated due to a fault, removing the reserved water supply time period information of the furnace tube from the reservation queue.

9. The method according to claim 1, wherein further comprising:

in response to the reserved water supply time period information in the reservation queue being empty, and after the target furnace tube receives the water supply instruction, determining whether the target furnace tube is in a process state;

in response to the target furnace tube being in the process state, setting the target furnace tube to prohibit water supply;

in response to the target furnace tube not being in the process state, determining whether the liquid evaporator is in the available state for the target furnace tube;

in response to the liquid evaporator being in the available state for the target furnace tube, setting the target furnace tube to supply water; and in response to the liquid evaporator being in the unavailable state for the target furnace tube, setting the target furnace tube to prohibit water supply.

10. A water supply control device for a semiconductor process device configured to control a liquid evaporator in the semiconductor process device to supply replenish water for each furnace tube sharing of a plurality of furnace tubes that share the liquid evaporator, wherein the water supply control device includes at least one processor; at least one memory; and at least one program stored in the memory; wherein when the at least one program is executed by the at least one processor, the at least one processor is caused to perform:

obtaining water supply time period information that each of the plurality of furnace tubes needs to reserve;

according to the water supply time period information that each of the plurality of furnace tubes needs to reserve, updating a reservation queue at a current moment; and according to the water supply time period information in the updated reservation queue, setting the liquid evaporator to be in an available state or an unavailable state for each of the plurality of furnace tubes, such that the liquid evaporator supplies water to only one furnace tube at a time.

11. A semiconductor process device comprising a liquid evaporator, a controller, and a plurality of furnace tubes sharing the liquid evaporator, wherein the controller is configured to control the liquid evaporator to supply water to the plurality of furnace tubes, and is configured to perform:

obtaining water supply time period information that each of the plurality of furnace tubes needs to reserve;

according to the water supply time period information that each of the plurality of furnace tubes needs to reserve, updating a reservation queue at a current moment; and according to the water supply time period information in the updated reservation queue, setting the liquid evaporator to be in an available state or an unavailable state for each of the plurality of furnace tubes, such that the liquid evaporator supplies water to only one furnace tube at a time.

* * * * *